United States Patent

Iino et al.

(10) Patent No.: US 6,340,391 B1
(45) Date of Patent: Jan. 22, 2002

(54) METHOD FOR PRODUCING SINGLE CRYSTAL AND PULLING DEVICE

(75) Inventors: Eiichi Iino, Annaka; Kouji Kitagawa, Nishishirakawa-gun, both of (JP)

(73) Assignee: Shin-Etsu Handotai Co., Tokyo (JP)

( * ) Notice: Subject to any disclaimer, the term of this patent is extended or adjusted under 35 U.S.C. 154(b) by 0 days.

(21) Appl. No.: 09/622,181

(22) PCT Filed: Dec. 6, 1999

(86) PCT No.: PCT/JP99/06815

§ 371 Date: Aug. 14, 2000

§ 102(e) Date: Aug. 14, 2000

(87) PCT Pub. No.: WO00/40786

PCT Pub. Date: Jul. 13, 2000

(30) Foreign Application Priority Data

Dec. 28, 1998 (JP) .............................. 10-372793

(51) Int. Cl.⁷ .............................................. C30B 15/02
(52) U.S. Cl. ..................... 117/13; 117/217; 117/218; 117/900; 117/911
(58) Field of Search ........................... 117/13, 217, 218, 117/900, 911

(56) References Cited

U.S. PATENT DOCUMENTS 6,015,461 A * 1/2000 Izumi ..................... 117/218
6,183,556 B1 * 2/2001 Aydelott et al. ............ 117/218

FOREIGN PATENT DOCUMENTS

| EP | A1-0619387 | 3/1994 |
| JP | A-63-206382 | 8/1988 |
| JP | A-6-279172 | 10/1994 |
| JP | A-9-208382 | 8/1997 |

* cited by examiner

Primary Examiner—Felisa Hiteshew
(74) Attorney, Agent, or Firm—Oliff & Berridge, PLC

(57) ABSTRACT

A method for producing a single crystal by pulling the single crystal with a wire according to the Czochralski method, wherein temperature around an end of joint part of the wire and a seed crystal holder is controlled so as not to exceed 1200° C., preferably 800° C., at any time, and material of the wire is one selected from tungsten, stainless steel and molybdenum, and a pulling apparatus therefor. According to the present invention, there can be provided a method in which temperature around an end of joint part of a wire and a seed crystal holder is controlled so as not to exceed a temperature at which material degradation of the wire begins during the period of from seeding to an early stage of the pulling, and a pulling apparatus therefor.

13 Claims, 3 Drawing Sheets

METHOD FOR PRODUCING SINGLE CRYSTAL AND PULLING DEVICE

TECHNICAL FIELD

The present invention relates to a method for producing a single crystal by melting a polycrystal raw material and pulling a seed crystal from the melt of polycrystal according to the Czochralski method, and a pulling apparatus therefor.

BACKGROUND ART

Conventionally, as for the method of obtaining single crystal materials such as semiconductor silicon single crystals, there is widely used a method for obtaining them as cylindrical single crystals by the Czochralski method (referred to as "CZ method" hereinafter).

This CZ method is a method for producing a single crystal by melting a polycrystal raw material and pulling a seed crystal from the melt of the polycrystal. As the method for pulling a single crystal, there are a method using a shaft and a method using a wire.

In recent years, as the diameter of silicon single crystals produced by the CZ method becomes larger, the weight of the crystals is getting heavier. For such crystals of a heavier weight, there have been proposed to safely pull crystals without dislocations by improvement of load carrying capacity of apparatuses, use of necking with a thick diameter, novel methods without using necking, methods of mechanically holding crystals and so forth.

In such CZ method in which the pulling is attained with a wire, a tungsten wire, stainless steel wire or molybdenum wire of superior heat resistance and high hardness is used. As for such a wire, a thicker one is usually used as the crystals become to have a heavier weight.

By the way, it is known that tensile strength of a wire will be reduced as the temperature is increased. However, in the conventional pulling of single crystals of a small diameter and a low weight, there is almost no possibility of causing accidents such as breakage of the wire and drop of the single crystal, because, when load applied to the wire becomes large, distance between the wire and the melt becomes large and hence the temperature of the wire end is decreased.

In contrast, if single crystals of a large diameter and a heavy weight are pulled repeatedly, in the case of a tungsten wire, for example, degradation of the material and partial breakage of the wire has come to be generated.

According to the values mentioned in manufacturer's catalogs, tensile strength of tungsten wires of 240 kgf/mm$^2$ at ordinary temperature is decreased to 100 kgf/mm$^2$ at 1000° C., and it is decreased almost linearly.

According to the experiments of the inventors of the present invention, it was found that, if a wire was repeatedly used under a condition where the temperature of the wire becomes higher than that observed in the conventional pulling condition for single crystals of a small diameter, the wire was degraded and its strength was markedly reduced due to the high temperature. According to actual measurement, the temperature at which the degradation of the wire material begins is 1200° C. or more. In the conventional pulling of single crystals of a small diameter, the temperature scarcely exceeds this temperature. Even when the temperature exceeds that temperature, it is only for a short period of time, and thus degradation or strength reduction is scarcely observed.

However, as the diameter of crystals becomes larger, temperature distribution in furnaces of single crystal pulling apparatuses is changed and becomes different from that used for the conventional pulling of crystals of a small diameter, and the time during which the wire is exposed to a high temperature has become longer. Therefore, even if a wire is used in the same manner as the conventional method, the influence of heat tends to become larger and degradation of the wire has come to be observed.

DISCLOSURE OF THE INVENTION

The present invention was accomplished in view of such problems as mentioned above, and its major object is to provide a method for pulling a single crystal wherein temperature around an end of a joint part of a wire and a seed crystal holder is controlled so as not to exceed the temperature at which the degradation of the wire material begins during the period of from seeding to an early stage of the pulling, and a pulling apparatus therefor.

The present invention was accomplished in order to achieve the aforementioned object, and it provides a method for producing a single crystal by pulling the single crystal with a wire according to the Czochralski method, wherein temperature around an end of joint part of the wire and a seed crystal holder is controlled so as not to exceed 1200° C. at any time.

In the pulling of a single crystal by using a wire according to the CZ method, if the temperature around an end of a joint part of the wire and a seed crystal holder (also referred to as "temperature of a wire end" hereinafter) is controlled so as not to exceed 1200° C. at any time during the period of from the seeding as an early stage of the pulling to necking including the period where the end of the wire most closely approaches to the silicon melt surface as described above, the degradation of the wire material and the reduction of its tensile strength can be prevented, the seed crystal can be surely and safely held, and it becomes possible to stably pull a growing single crystal of a heavy weight.

In the above method, the material of the wire can be one selected from tungsten, stainless steel and molybdenum.

These metals and alloy show relatively little degradation of material and little reduction of strength even at high temperature under an inert gas atmosphere, and sufficiently function as a wire for pulling single crystals. In particular, their degradation can surely be suppressed at a temperature of 1200° C. or lower as defined above.

The present invention further provides a method for producing a single crystal, wherein length or lengths of a seed crystal holder and/or a seed crystal is/are adjusted according to temperature distribution in a furnace so that temperature of a wire end should not exceed 1200° C.

If the length or lengths of a seed crystal holder and/or a seed crystal is/are adjusted according to temperature distribution in a furnace, so that temperature of a wire end should not exceed 1200° C. at any time as described above, degradation of the material as well as the reduction of tensile strength can be prevented, the seed crystal can safely and surely be held, and a growing crystal of a heavy weight can stably be pulled.

For example, temperature distribution in a furnace for pulling a single crystal having a large diameter is different from temperature distribution in a furnace for pulling a single crystal having a small diameter, and the temperature in the region above the melt for the former reaches a temperature higher than that observed in the pulling of a single crystal having a small diameter by several tens degrees to 100° C. or more. A wire exposed to such a temperature becomes likely to suffer from degradation of material or reduction of strength. Therefore, if the length or lengths of a seed crystal holder and/or a seed crystal is/are adjusted to be extended so that temperature of a wire end should not exceed 1200° C. at any time including the time when it most closely approaches to the melt surface during the seeding, degradation of the material as well as the reduction of tensile strength can be prevented, the seed crystal can safely and surely be held, and a growing crystal of a heavy weight can stably be pulled.

The present invention further provides an apparatus for pulling a single crystal according to the CZ method comprising a seed crystal holder jointed to a wire and a seed crystal, wherein length or lengths of the seed crystal holder and/or the seed crystal is/are adjusted according to temperature distribution in a furnace so that temperature of a wire end should not exceed 1200° C.

If there is used such an apparatus for pulling a single crystal comprising a seed crystal holder jointed to a wire and/or a seed crystal of which length or lengths is/are adjusted according to temperature distribution in a furnace so that temperature of a wire end should not exceed 1200° C., temperature of a wire end does not exceed 1200° C. at any time including the time when it most closely approaches to the melt surface during the seeding, and thus the apparatus can be an apparatus for pulling a single crystal that can prevent the degradation of the material as well as the reduction of tensile strength, can safely and surely hold the seed crystal, and can stably pull a growing crystal of a heavy weight.

The present invention also provides a method for producing a single crystal by pulling the single crystal with a wire according to the Czochralski method, wherein temperature around an end of joint part of the wire and a seed crystal holder is controlled so as not to exceed 800° C. at any time.

In the pulling of a single crystal by using a wire according to the CZ method, if temperature around an end of a joint part of the wire and a seed crystal holder is controlled so as not to exceed 800° C. at any time during the period of from the seeding of the early stage to necking including the period where the end of the wire most closely approaches to the silicon melt surface as described above, the degradation of the wire material and the reduction of its tensile strength can substantially be avoided, the seed crystal can be surely and safely held, and it becomes possible to stably pull a growing crystal of a heavy weight.

The present invention further provides a method for producing a single crystal, wherein length or lengths of a seed crystal holder and/or a seed crystal is/are adjusted according to temperature distribution in a furnace, so that temperature of a wire end should not exceed 800° C.

If the length or lengths of a seed crystal holder and/or a seed crystal is/are adjusted according to temperature distribution in a furnace, so that temperature of a wire end should not exceed 800° C. at any time as described above, the degradation of the material as well as the reduction of tensile strength can substantially be avoided, the seed crystal can safely and surely be held, and a growing crystal of a heavy weight can stably be pulled.

The present invention further provides an apparatus for pulling a single crystal according to the CZ method comprising a seed crystal holder jointed to a wire and a seed crystal, wherein length or lengths of the seed crystal holder and/or the seed crystal is/are adjusted according to temperature distribution in a furnace so that temperature of a wire end should not exceed 800° C.

If there is used such an apparatus for pulling a single crystal comprising a seed crystal holder jointed to a wire and/or a seed crystal of which length or lengths is/are adjusted according to temperature distribution in a furnace so that temperature of a wire end should not exceed 800° C., temperature of a wire end does not exceed 800° C. at any time including the time when it most closely approaches to the melt surface during the seeding, and thus the apparatus can be an apparatus for pulling a single crystal that can substantially avoid the degradation of the material as well as the reduction of tensile strength, can safely and surely hold the seed crystal, and can stably pull a growing crystal of a heavy weight.

According to the present invention, by controlling temperature around an end of joint part of the wire and a seed crystal holder so as not to exceed 1200° C., preferably 800° C., at any time, possibility of causing accidents such as breakage of the wire and drop of the single crystal is substantially eliminated, which are the problems observed in the pulling of recently used single crystals of a large diameter and a heavy weight. Therefore, holding of a seed crystal using a wire is made safe and sure, and a single crystal can be stably and efficiently pulled even when a growing single crystal having a large diameter and a heavy weight is held.

Moreover, it becomes possible to use a wire repeatedly and its renewal frequency is reduced. Therefore, safety of the operation can be increased, and the cost can simultaneously be improved markedly.

BRIEF EXPLANATION OF THE DRAWINGS

FIG. 4 includes longitudinal sectional explanatory views showing jointing state of a wire, a seed crystal holder and a seed crystal used in each test.

BEST MODE FOR CARRYING OUT THE INVENTION

Hereafter, the present invention will be explained in detail. However, the present invention is not limited by the following explanation.

The inventors of the present invention investigated and examined the cause of the degradation of wire material and the reduction of strength, which were likely to occur when a single crystal having a large diameter was pulled. As a result, it was found that, in the furnace temperature distribution, temperature mainly in the region above the melt reached a temperature higher than that observed in the pulling of a single crystal having a small diameter by several tens degrees to 100° C. or more, and the degradation of the wire material and the reduction of strength were caused because the wire was exposed to such a region of a high temperature for a long period of time. They also found that the problem could be solved by using a longer seed crystal holder and/or longer seed crystal so that the temperature of the wire end should be a temperature below the temperature at which the material began to be degraded, and they defined various conditions for satisfying the requirement. Thus, they accomplished the present invention.

First, a seed crystal holder for holding a seed crystal will be explained by referring to a drawing showing an example thereof, which holder is provided in the apparatus for pulling a single crystal according to the present invention and is attached to an end of a wire for pulling.

Figure 1:
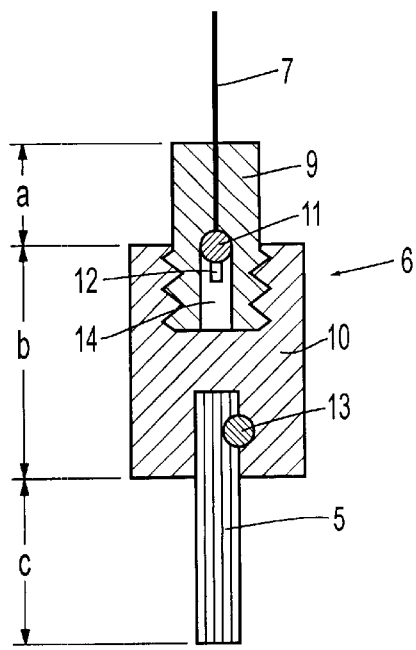
FIG. 1 is a longitudinal sectional explanatory view showing an exemplary jointing state of a wire, a seed crystal holder and a seed crystal.

FIG. 1 is a longitudinal sectional explanatory view of a seed crystal holder of caulking attachment type.

As shown in FIG. 1, the seed crystal holder 6 of caulking attachment type is constituted by a holder body 10 made of carbon and a vertically inserted plug 9 which is screwed on the holder body 10. Further, an end of a seed crystal 5 is inserted into a vertical hole provided in the lower part of the holder body 10, and a seed crystal 5 is fixed with a pin 13 driven along the direction perpendicular to the seed crystal. The crystal holder is jointed with a wire 7 as follows. That is, the wire 7 is penetrated into a vertical center hole of the plug 9 from above, and is further penetrated into a vertical center hole of a spherical body 11, which slidably contacts with an upper hemispheric surface in a hole 14 of the plug. And a sleeve 12 is put on the end of the wire 7 and fixed on it by caulking to form an end of joint part so that the wire should be jointed to the holder.

As another joint scheme, for example, the wire can be fixed to the seed crystal holder by forming a loop with the end portion of the wire 7 in the hole 14 of the plug and driving a pin from the outside of the plug (not shown in the drawing).

By the way, the problem of such a seed crystal holder as mentioned above is that, if a tungsten wire is used, for example, degradation of the wire material or partial breakage of the wire comes to be observed when single crystals of a large diameter and a heavy weight are repeatedly pulled. This phenomenon is considered to be caused by the fact that the temperature around the end of the caulking joint part or the loop end and portions within the plug 9 and in the vicinity of it becomes higher compared with the case of the pulling of conventional single crystals of a small diameter.

Unlike the above, it is considered that, in the conventional pulling of a single crystal of a small diameter and a low weight, there is almost no possibility of causing accidents such as breakage of the wire and drop of the single crystal, because, when load applied to the wire becomes large, distance between the wire and the melt has become large and hence the temperature of the wire end has been decreased.

Therefore, it was conceived that, if the temperature of the wire end was controlled so that it should not exceed the temperature at which the wire material began to be degraded at any time, the degradation, reduction of strength and accidental breakage of the wire could be prevented and thus it became possible to safely and surely pull single crystals of a large diameter and a heavy weight.

Therefore, temperature distribution in a furnace was examined and compared first for the case where the pulling was performed with the conditions for conventional single crystals of a small diameter and the case where the pulling was performed with the conditions for single crystals of a large diameter. Further, degradation of the wire was examined.

(Test 1)

As for the pulling conditions of single crystals of a small diameter, silicon single crystals having a diameter of 150 mm (6 inches) were pulled from silicon polycrystal melt in a quartz crucible having a diameter of 450 mm (18 inches) at a growth rate of 1 mm/min.

As for the dimensions of the seed crystal holder represented in the aforementioned FIG. 1, a (length of a protruding potion of the plug) was set to be 30 mm, b (length of the holder body) was set to be 60 mm, and c (length of a protruding potion of the seed crystal) was. Se to be 40 mm. Therefore, a distance d (mm) from the melt surface to the end of the wire was d=b+c=about 100 (mm), when the end of the wire most closely approached to the silicon melt surface. As the wire, a tungsten wire was used.

As for the pulling conditions of single crystals of a large diameter, silicon single crystals having a diameter of 250 mm (10 inches) were pulled from silicon polycrystal melt in a quartz crucible having a diameter of 750 mm (30 inches) at a growth rate of 1 mm/min.

Figure 2:
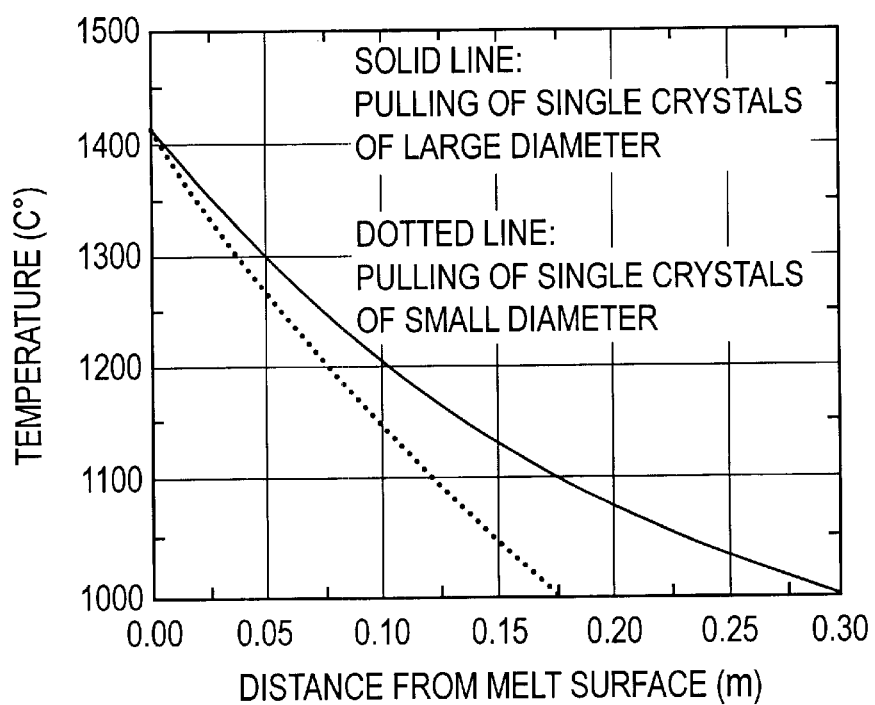
FIG. 2 is a graph showing exemplary temperature distribution in a furnace of a single crystal pulling apparatus.

The results of the measurement of temperature distribution in the furnace (when the temperature at the center of the melt surface was 1420° C.) are shown in FIG. 2. As seen from the results of FIG. 2, if the distance from the silicon melt surface along the height direction is the same, the temperature in the pulling for the larger diameter was higher.

The degradation of the wire was as follows.

The wire showed no abnormality in visual inspection after production of 20 single crystals under the aforementioned pulling conditions for single crystals of a small diameter, and it maintained 90% of tensile strength compared with that measured before the use. It can be seen from FIG. 2 that, in this case, the temperature of the wire end was about 1150° C. when it was most closely approached to the melt surface (100 mm).

On the other hand, in visual inspection, five filaments constituting the wire (composed of many twisted filaments) were broken after production of 20 single crystals under the aforementioned pulling conditions for single crystals of a large diameter. When the wire was tested for tensile strength, it was found to have a tensile strength reduced by about 60% compared with that observed for the wire used for the pulling of the crystals of a small diameter. It can be seen from FIG. 2 that, in this case, the temperature of the wire end was about 1210° C. (average of the actually measured values was 1220° C. after the production of 20 single crystals) when it was most closely approached to the melt surface (100 mm).

Therefore, it was found that the material degradation became likely to occur when the wire was used under a condition that the temperature of the wire end exceeded 1200° C.

The measurement of tensile strength was performed as follows.

First, in order to measure tensile strength of a portion of the wire exposed to an elevated temperature, the wire was cut with a length of 50 cm from the end, and a loop was formed at the cut end of the cut wire by using a caulking metal fitting so that the length from the end of the wire end to the end of the loop should become about 40 cm.

The strength test of the wire was performed by using a universal tensile tester, TCM-2000 (made by Minebea Co., Ltd.). The wire was set on the apparatus by using a joint fitting for holding the loop side of the wire, which was fixed to one chucking rod of the tensile tester, and a joint fitting for holding the caulking metal fitting at the wire end, which was fixed to the other chucking rod of the tensile tester.

The strength test was performed at room temperature and breaking load was measured at a pulling rate of 10 mm/min.

(Test 2)

Then, 20 single crystals having a large diameter were pulled under such conditions that the temperature of the wire end should not exceed 1200° C., i.e., by using a seed crystal holder having the length b extended to 100 mm and a distance d of 140 mm from the melt surface to the end of the tungsten wire at the time of seeding. As a result, no degradation of the wire material and no breakage of the wire were generated. It can be seen from FIG. 2 that, in this case, the temperature of the wire end was about 1150° C. when it was most closely approached to the melt surface (140 mm).

From the results of the aforementioned tests, it was found that, when a single crystal having a large diameter was pulled, exposure of the wire end to high temperature should be avoided by using an increased distance from the melt surface to the wire end.

Specifically, if the conditions are adjusted so that the temperature of the wire end should not exceed 1200° C., preferably the temperature of the wire end should be 1150° C. or lower, it becomes possible to secure 90% of tensile strength compared with that observed before use even after production of 20 single crystals.

As described above, it is possible to avoid the degradation of the wire material or marked reduction of tensile strength by controlling the conditions so that the temperature of the wire end should not exceed 1200° C. during the production of single crystals. However, even when the temperature of the wire end was controlled to be 1200° C. or less, reduction of tensile strength by 10% was observed compared with that observed before the use.

Of course, when a lot of single crystals are produced on a commercial basis, it is preferred that the reduction of tensile strength of the wire is stably extremely small during use or after use.

Based on the results mentioned above, the inventors of the present invention considered that the aforementioned reduction of tensile strength by 10% was caused by the fatigue of the metal due to the tensile load applied by the growing single crystal of a heavy weight and the twisting load applied by the rotational driving of the growing single crystal in the high temperature region.

(Test 3)

Figure 4A:
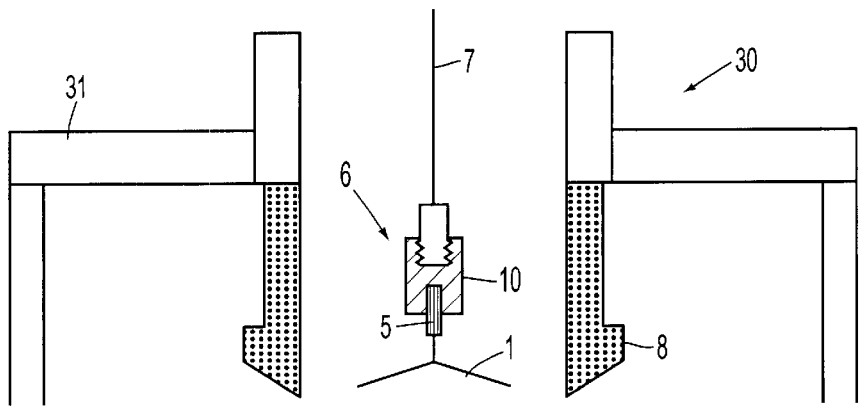
FIG. 4(A) is for a case where a conventional seed crystal holder is used.
Figure 4B:
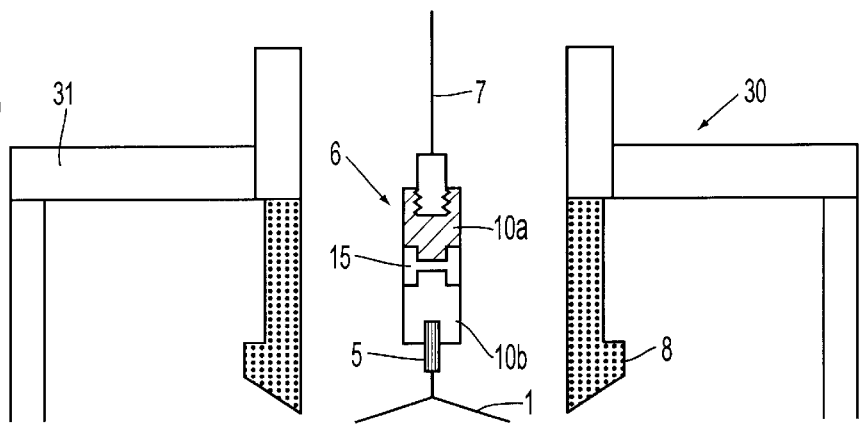
FIG. 4(B) is for a case where a holder body is divided and a short spacer is provided between the divided portions.
Figure 4C:
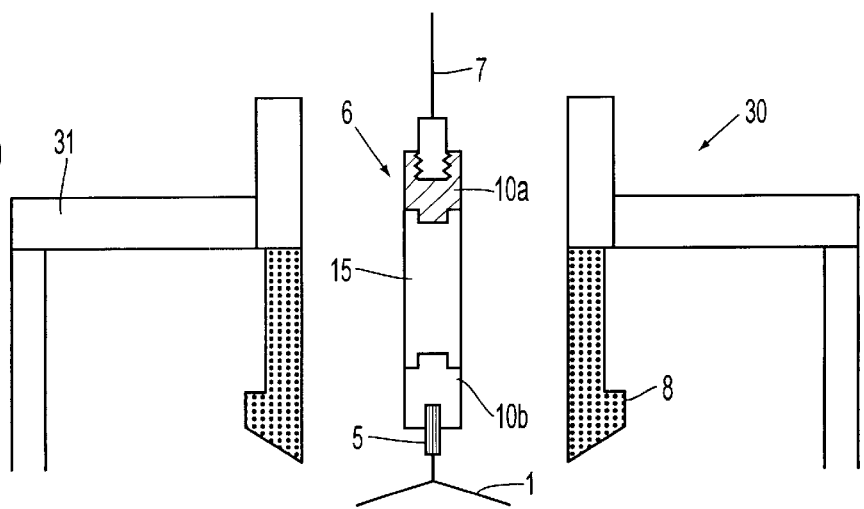
FIG. 4(C) is for a case where a holder body is divided and a long spacer is provided between the divided portions.

Therefore, the length of the seed crystal holder was adjusted by using the structures shown in FIG. 4(B) or 4(C), so that the temperature of the wire end should be 1150° C., 1000° C. or 800° C. when it most closely approached to the melt surface. Ten tungsten wires were used for each case, and 20 single crystals were pulled for each wire. The tensile strength of each wire after the use was confirmed.

The results of the above measurement are shown in the following Table 1. The values in Table 1 are represented as relative values based on the tensile strength of an intact wire, which is taken as 100%.

Comparative Example

A test was performed in the same manner as in (Test 3) except that the length of the seed crystal holder was controlled by using the structure shown in FIG. 4(A), so that the temperature of the wire end should be 1220° C. when it most closely approached to the melt surface, and one tungsten wire was used. Then, the tensile strength of the wire after the use was confirmed.

The result of this test is also shown in Table 1.

TABLE 1

|  | Temperature of wire end (maximum temperature) | Average tensile strength (after use/before use) (%) | Standard deviation (%) |
| --- | --- | --- | --- |
| Comparative Example | 1220° C. | 36 n = 1 | — |
| Test 3 | 1150° C. | 89.8 n = 10 | 1.14 |
|  | 1000° C. | 94.9 n = 10 | 0.86 |
|  | 800° C. | 98.1 n = 10 | 0.55 |

As clearly seen from the results shown in Table 1, the average tensile strength was 36% as compared with the value before use when the temperature of the wire end was 1220° C., whereas it was about 90%, about 95% and about 98% of the value before use when the temperature of the wire end was 1150° C., 1000° C. and 800° C., respectively. Further, the dispersion of the tensile strength among each ten wires became smaller, as the temperature at which they were used became lower.

Therefore, if the temperature of wire end is controlled so as not to exceed 800° C., the decrease of tensile strength is stably very small, and the degradation of the wire material can also be avoided.

Now, the high temperature region is speculated in view of the pulling operation. In the pulling of a single crystal using a wire according to the CZ method, as an initial operation thereof, a seed crystal, which is held by a seed crystal holder jointed to the end of the wire, is descended and brought into contact with silicon melt or immersed into the silicon melt, which is heated to a high temperature of 1420° C. or more, for seeding. Then, the seed crystal is ascended, and a growing crystal is subjected to necking, in which a neck portion is formed in order to eliminate dislocations generated by thermal shock, and pulled as a single crystal having a diameter increased to a desired size.

In this initial stage, in the time period during which the wire end most closely approaches to the silicon melt surface, the wire is present in the highest temperature region. Therefore, if the temperature around the end of the joint part of the wire and the seed crystal holder (also referred to as "temperature of a wire end" hereinafter) including the temperature when it is in the aforementioned highest temperature region is controlled so as not to exceed 1200° C. at any time, both of the degradation of the wire material and the reduction of tensile strength can be avoided. More preferably, if the temperature of wire end is controlled so as not to exceed 800° C. at any time, both of the degradation of the wire material and the reduction of tensile strength can substantially be avoided, the seed crystal can be surely and safely held, and it becomes possible to stably pull a growing single crystal of a heavy weight.

Specifically, since the temperature at which the degradation of the wire material begins is actually determined to be 1200° C. for a tungsten wire, the length or lengths of a seed crystal holder and/or a seed crystal is/are adjusted according to temperature distribution in a furnace so that the temperature of wire end should not exceed 1200° C. at any time, preferably 800° C. at any time when further higher safety is desired. By doing so, the degradation of the wire material and the reduction of tensile strength can be avoided, the seed crystal can be surely and safely held, and it becomes possible to stably pull a growing single crystal of a heavy weight.

In this case, the material of the wire may be one selected from tungsten, stainless steel, molybdenum and so forth.

These metals and alloy show relatively little material degradation and little reduction of strength by high temperature in an inert atmosphere, and can satisfactorily serve as a material of a wire for pulling single crystals of a large diameter. As described above, they are hardly degraded if they were used at a temperature of 1200° C. or lower, preferably 800° C. or lower.

The apparatus of the present invention for pulling a single crystal according to the CZ method will be explained hereafter by referring to FIGS. 1, 3 and 4.

Figure 3:
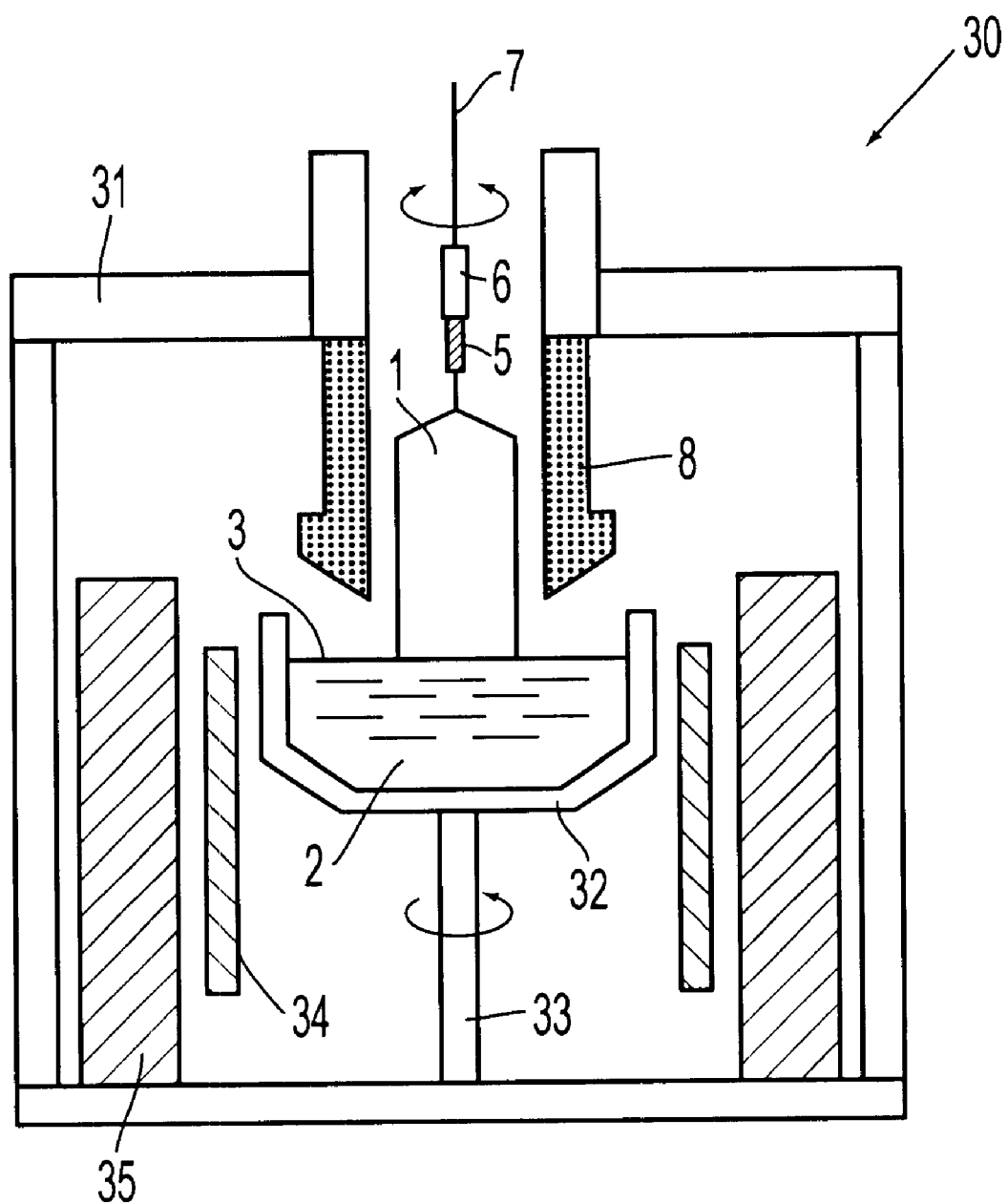
FIG. 3 is a schematic explanatory view showing an exemplary single crystal pulling apparatus for which the method of the present invention is used.

An exemplary apparatus for pulling a single crystal used in the CZ method is shown in FIG. 3. As shown in the figure, the apparatus 30 for pulling a single crystal is constituted by a pulling chamber 31, in which a crucible 32 accommodating silicon melt 2 is provided, a crucible supporting shaft 33 for rotating the crucible 32 and a rotation mechanism therefor (not shown), a seed crystal holder 6 for holding a seed crystal 5, a wire 7 for pulling the seed crystal holder 6, and a winding mechanism (not shown) for rotating and winding the wire 7. A heater 34 is disposed around the crucible 32, and a heat insulating material 35 is disposed around the heater 34. A single crystal is pulled in such a structure as described above. An upper heat insulating material 8 may be provided in order to control the temperature distribution in the furnace.

The apparatus of the present invention is characterized in that it is provided with the seed crystal holder 6 jointed to a wire 7 and/or the seed crystal 5 of which length or lengths is/are adjusted depending on the temperature distribution in the furnace so that the temperature of the end of the wire 7 should not exceed 1200° C., more preferably 800° C. (see FIG. 1 and FIG. 4).

In order to determine the length or lengths of the seed crystal holder 6 and/or the seed crystal 5, temperature distribution in a furnace such as shown in FIG. 2 is first determined for a specific scale of apparatus for pulling a single crystal (on the basis of diameter of growing single crystal), structure in the furnace and pulling conditions (pulling rate etc.) by actual measurement or by simulation using a global heat transfer analysis software. Then, such a length that the temperature of wire end should not exceed 1200° C., preferably 800° C., is calculated, and the length or lengths of the seed crystal holder 6 and/or the seed crystal 5 are/is decided.

The length or lengths of the seed crystal holder 6 and/or the seed crystal 5 decided as described above can be actually obtained by adjustment using a seed crystal holder 6 such as shown in FIG. 4(B) or 4(C).

More specifically, the adjustment is attained as follows. The apparatus 30 for pulling a single crystal comprises the seed crystal holder 6 for holding the seed crystal 5 and the wire 7 for pulling the seed crystal holder 6. FIG. 4(A) represents a case where the seed crystal holder 6 of FIG. 1 is used, FIG. 4(B) represents a case where the holder body 10 of FIG. 1 is divided into an upper holder body 10a and a lower holder body 10b and a short spacer 15 is provided between them, and FIG. 4(C) represents case where a long spacer 15 is provided between the upper holder body 10a and the lower holder body 10b.

In the above structure, the length of the holder body 10 can be changed by arbitrarily changing the length of the body itself. However, as shown in FIG. 4(B) and FIG. 4(C), it can be adjusted more easily by dividing the holder body 10 into the upper holder body 10a and the lower holder body 10b, and providing the spacer 15, and changing the length of the spacer 15. It is also possible to arbitrarily adjust the length of the seed crystal holder by further dividing the holder body, by providing a plurality of spacers, or the like.

If an apparatus 30 is used, which is provided with a seed crystal holder 6 jointed to a wire 7 and seed crystal 5 wherein the length or lengths of the seed crystal holder 6 and/or the seed crystal 5 is/are adjusted according to temperature distribution in the furnace so that the temperature around the end of the joint part of the wire 7 and the seed crystal holder 6 should not exceed 1200° C. or 800° C., the temperature of the end of the wire 7 should not exceed 1200° C. or 800° C. at any time including the time of seeding when the end of the wire 7 most closely approaches to the melt surface 3. Thus, the apparatus 30 can be an apparatus that can prevent degradation as well as reduction of tensile strength of the wire material, safely and surely hold the seed crystal, and stably pull a growing crystal of a heavy weight.

Now, the method for growing a single crystal by the aforementioned apparatus 30 for pulling a single crystal will be explained. First, a silicon polycrystal material is melted in the crucible 32 by heating it to a temperature higher than the melting point thereof. Then, a tip end of the seed crystal 5 is brought into contact with, or immersed into the melt 2 at its center portion by reeling out the wire 7. Then, the crucible 32 is rotated in an optional direction, and the seed crystal 5 is simultaneously pulled upwardly by winding up the wire 7 with rotating the wire to start the growing of a single crystal. Thereafter, a single crystal 1 in a approximately cylindrical shape can be obtained by appropriately controlling the pulling rate and temperature.

The present invention is not limited to the embodiments described above. The above-described embodiments are mere examples, and those having the substantially same structure as that described in the appended claims and providing the similar functions and advantages are included in the scope of the present invention.

For example, while the aforementioned embodiments of the present invention were explained for the growth of silicon single crystal ingots having a diameter of 250 mm (10 inches), the present invention can satisfactorily be used for recently used silicon single crystals having a diameter of 300 mm (12 inches) to 400 mm (16 inches) or more.

Further, while the above explanation was made for the CZ method, the present invention can of course be used for the so-called MCZ method (pulling method in magnetic field).

Furthermore, while the length or lengths of a seed crystal holder and/or a seed crystal was/were adjusted in the above explanation in order to obtain a wire end temperature of 1200° C. or lower, or 800° C. or lower, the present invention is not limited to such adjustment scheme. The temperature of 1200° C. or lower, or 800° C. or lower may also be obtained by modifying structures in the furnace, operation conditions and so forth.

What is claimed is:

1. A method for producing a single crystal by pulling the single crystal with a wire according to the Czochralski method, wherein temperature around an end of joint part of the wire and a seed crystal holder is controlled so as not to exceed 1200° C. at any time.

2. The method for producing a single crystal according to claim 1, wherein material of the wire is one selected from tungsten, stainless steel and molybdenum.

3. The method for producing a single crystal according to claim 2, wherein a length of the seed crystal holder or a seed crystal is adjusted according to temperature distribution in a furnace so that temperature of a wire end does not exceed 1200° C.

4. The method for producing a single crystal according to claim 1, wherein lengths of the seed crystal holder and a seed crystal are adjusted according to temperature distribution in a furnace so that temperature of a wire end does not exceed 1200° C.

5. The method for producing a single crystal according to claim 2, wherein lengths of the seed crystal holder and a seed crystal are adjusted according to temperature distribution in a furnace so that temperature of a wire end does not exceed 1200° C.

6. The method for producing a single crystal according to claim 1, wherein a length of the seed crystal holder or a seed crystal is adjusted according to temperature distribution in a furnace so that temperature of a wire end does not exceed 1200° C.

7. A method for producing a single crystal by pulling the single crystal with a wire according to the Czochralski method, wherein temperature around an end of joint part of the wire and a seed crystal holder is controlled so as not to exceed 800° C. at any time.

8. The method for producing a single crystal according to claim 7, wherein lengths of the seed crystal holder and a seed crystal are adjusted according to temperature distribution in a furnace, so that temperature of a wire end does not exceed 800° C.

9. The method for producing a single crystal according to claim 7, wherein a length of the seed crystal holder or a seed crystal is adjusted according to temperature distribution in a furnace, so that temperature of a wire end does not exceed 800° C.

10. An apparatus for pulling a single crystal according to the Czochralski method comprising a seed crystal holder jointed to a wire and a seed crystal, wherein lengths of the seed crystal holder and the seed crystal are adjusted according to temperature distribution in a furnace so that temperature of a wire end does not exceed 1200° C.

11. An apparatus for pulling a single crystal according to the Czochralski method comprising a seed crystal holder jointed to a wire and a seed crystal, wherein lengths of the seed crystal holder and the seed crystal are adjusted according to temperature distribution in a furnace so that temperature of a wire end does not exceed 800° C.

12. An apparatus for pulling a single crystal according to the Czochralski method comprising a seed crystal holder jointed to a wire and a seed crystal, wherein a length of the seed crystal holder or the seed crystal is adjusted according to temperature distribution in a furnace so that temperature of a wire end does not exceed 1200° C.

13. An apparatus for pulling a single crystal according to the Czochralski method comprising a seed crystal holder jointed to a wire and a seed crystal, wherein a length of the seed crystal holder or the seed crystal is adjusted according to temperature distribution in a furnace so that temperature of a wire end does not exceed 800° C.

* * * * *